United States Patent [19]

Bobbio

[11] Patent Number: 4,826,754
[45] Date of Patent: May 2, 1989

[54] METHOD FOR ANISOTROPICALLY HARDENING A PROTECTIVE COATING FOR INTEGRATED CIRCUIT MANUFACTURE

[75] Inventor: Stephen M. Bobbio, Wake Forest, N.C.

[73] Assignee: Microelectronics Center of North Carolina, Research Triangle Park, N.C.

[21] Appl. No.: 42,932

[22] Filed: Apr. 27, 1987

[51] Int. Cl.$^4$ .............................................. G03C 5/00
[52] U.S. Cl. .................................. 430/311; 430/313; 430/317; 437/227; 156/628; 156/643
[58] Field of Search ............... 430/314, 315, 316, 317, 430/313, 325, 311; 156/643, 628; 437/35, 36, 229; 250/492.21, 492.3

[56] References Cited

U.S. PATENT DOCUMENTS

| | | | |
|---|---|---|---|
| 3,997,345 | 12/1976 | Sakurai et al. | 430/294 |
| 4,068,018 | 1/1978 | Hashimoto et al. | 427/38 |
| 4,115,120 | 9/1978 | Dyer et al. | 437/187 |
| 4,231,811 | 11/1980 | Somekh et al. | 148/1.5 |
| 4,268,615 | 5/1981 | Yonezawa | 430/320 |
| 4,499,177 | 2/1985 | Vollenbroek et al. | 430/311 |
| 4,529,860 | 7/1985 | Robb | 219/121 PE |
| 4,543,320 | 9/1985 | Vijan | 430/314 |

OTHER PUBLICATIONS

VLSI Technology-by S. M. Sze-copyright 1983, McGraw-Hill Book Co., New York, pp. 267-273.

Primary Examiner—José G. Dees
Attorney, Agent, or Firm—Bell, Seltzer, Park & Gibson

[57] ABSTRACT

A method for anisotropically hardening a protective coating to provide a well defined edge thereon for forming features which may be smaller than the resolution limit of the exposure equipment for the purpose of integrated circuit manufacture is disclosed. The method includes the steps of forming a non-planar coating on a substrate with a photoresist material having a sensitivity to incident flux that varies as a function of the angle of the incidence of the flux upon the coating. The coating is anisotropically hardened by exposing it to flux to which it has a relatively high sensitivity so that portions for which the flux is incident at one angle are more hardened than those portions where the flux is incident at a different angle.

7 Claims, 1 Drawing Sheet

METHOD FOR ANISOTROPICALLY HARDENING A PROTECTIVE COATING FOR INTEGRATED CIRCUIT MANUFACTURE

BACKGROUND OF THE INVENTION

This invention relates to a method for anisotropically (or directionally) hardening a protective film for integrated circuit manufacture in order to produce very small features in a masking layer.

Present techniques for forming small features in the thin films in integrated circuit manufacture make use of etching in the presence of etch resistant layers or sections of photoresist that have been irradiated to provide a selected pattern. This involves traditional photo engraving or photolithographic processes. However, with the continued miniaturization of semiconductor integrated circuits it has become increasingly difficult to maintain the necessary resolution between lines and features which comprise the components of the integrated circuit.

Alternative methods, which are well known in the art, have been designated expandable mask methods, liftoff methods or stencil methods. However, because of the methods used for hardening the photoresist and then etching non-hardened areas, some of the deposited films have an undesirable negative slope or overhang which poses problems to subsequent processing steps. Similarly, some current wet chemical and high pressure plasma etch processes often produce unwanted lateral etching which undercuts the deposited film. As the size and geometries of the devices have continued to shrink, as well as the openings and lines therein, the necessity for closely spaced features and openings, and the necessity to accurately maintain a high degree of resolution, has made more acute the need for a thin film with an anisotropically hardened edge that is very well defined to produce small features in the masking layer.

The problem is highlighted with a photoresist film that is coated onto a non-planar substrate having small isolated features or a group of features that are bunched close together. The non-planar surface scatters the incident radiation used to harden the photoresist and may result in excessive film loss. Whether the undesired result is over-development, over-exposure, or any other baseline shifting, the features may be enlarged, resulting in a profile which is dramatically different from that desired. While the features may be widely spaced to obtain the proper resolution, the spacing is excessive and packing density suffers. Reactive ion etching and ion milling have been used to minimize standing wave patterns caused by interference from reflected light and to provide a well defined or step edge on the protective film, but this requires three level processing, namely, a thick organic film, an inorganic intermediate masking layer, and a thin top layer of X-ray or E-beam photoresist.

In view of the need for a method for providing very small features in a protective film used in integrated circuit manufacture, the need existed for a method for anisotropically hardening the film to define the desired edge.

Accordingly, it is an object of the present invention to create such features by anisotropically hardening a protective film for integrated circuit manufacture to provide a well defined edge. It is a further object of the present invention to provide methods by which such hardening may be accomplished.

It is another object of the present invention to provide an improved method for avoiding the unnecessary feature enlargement often associated with conventional photolithographic processing.

SUMMARY OF THE INVENTION

These and other objects and advantages are achieved in accordance with the invention through a method for anisotropically hardening a protective coating to provide a well defined edge. A non-planar coating is formed on a substrate with a photoresist material that is resistant to subsequent processing steps after exposure to an incident flux. The sensitivity of the coating to the incident flux is a function of the angle of incidence of the flux upon the coating, and is anisotropically hardened by exposing it to a dosage of flux incident at an angle to which the coating has a high sensitivity. Those portions of the coating irradiated at an angle corresponding to a higher sensitivity are hardened to subsequent processing steps, and those portions irradiated at an angle corresponding to a lower sensitivity are less hardened. The method may also include removing portions of the coating or underlying substrate using anisotropic and isotropic etches.

DETAILED DESCRIPTION OF THE PREFERRED EMBODIMENTS

Figure 1:
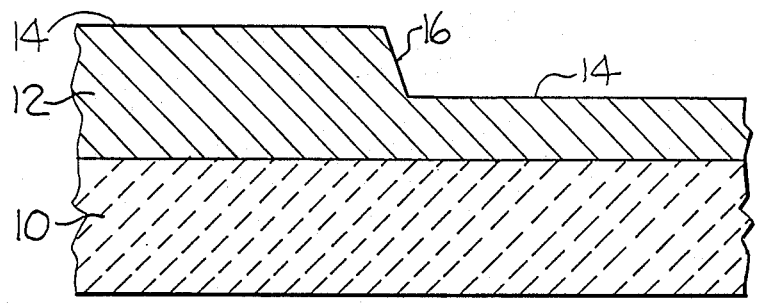
FIG. 1 illustrates a semi-conductor substrate having a non-planar coating of resist material deposited thereon.

FIG. 1 illustrates a typical structure encountered in semiconductor manufacture. A substrate 10, silicon or the like, has deposited thereon a material 12 that will either comprise a part of the semi-conductor device or be used as an aid in manufacturing the device. The deposited material has a non-planar surface, with some surface portions, such as 14, generally parallel to the substrate surface, and other surface portions, such as 16, oblique to the substrate surface. Although the substrate 10 is illustrated with a planar surface, this is not necessary.

Figure 2:
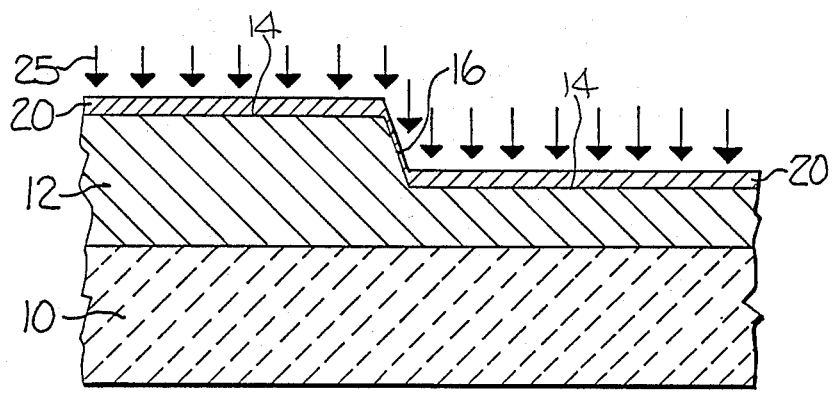
FIG. 2 illustrates the exposure of the coating of FIG. 1 to realize an anisotropically hardened top layer.

Referring to FIG. 2, the deposited material 12 and substrate 10 are exposed to a directional flux 25 which either directly deposits material or chemically changes the underlying material 12. The results is the formation of a top layer 20 which is shown in FIG. 2. The thickness of the top layer 20 is a function of the angle of incidence of the flux 25 upon the deposited material. For the situation shown in FIG. 2 top layer 20 is much thinner in the region of the edge or sidewall 16.

Two specific examples will be given. In a first example the layer 12 is a conventional organic polymer such as Shippley positive resist material and the directional flux is comprised of silicon atoms, as from a conventional evaporator. The layer 20 is then amorphous silicon. In a second example the layer 12 is a dyed positive resist which is very susceptible to silylation, i.e. the addition of silcon. An example of such material is a UCB product called Desire. The flux 25 is then a flux of radiation between 2,000 and 5,000 Angstroms which is suitable for exposure of the underlying material 12. The material, so exposed, is very susceptible to the incorporation of silicon from a suitable vapor phase source, such as HMDS or hexamethaldisilazane vapors. The silicon is selectively absorbed into the exposed areas and thus the region 20 is made silicon rich.

Figure 3:
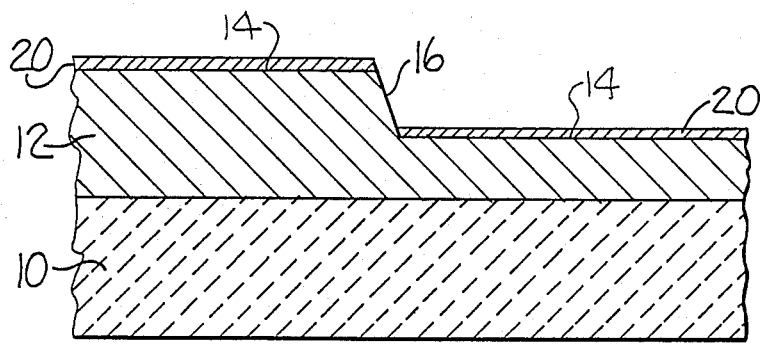
FIG. 3 illustrates the structure of FIG. 2 after exposure and after an isotropic etch.

The composite shown in FIG. 2 is then subjected to an isotropic removal step which removes some of the hardened layer 20. The result is shown in FIG. 3, where the sidewall 16 of the deposited material is exposed, but the parallel surface 14 remains coated by the formed top layer 20. For either example the structure is exposed to a moderately high pressure plasma, such as a pressure in excess of 100 mtorr, made from a fluorinated gas, such as $C_2F_6$ or $SF_6$. The action of the etch plasma is to uniformly remove a portion of the layer 20. The process is terminated when all of layer 20 has been removed from the sidewall 16.

Figure 4:
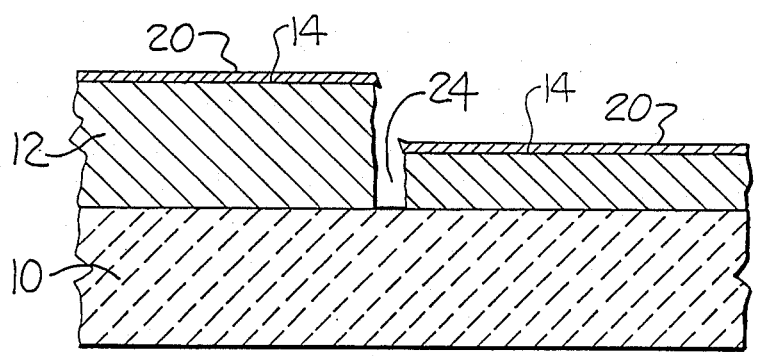
FIG. 4 illustrates the structure of FIG. 3 following an anisotropic etch of the deposited resist material.

The composite in FIG. 3, i.e. the exposed sidewall 16 and remaining top layer 20, is now exposed to a process which anisotropically etches the underlayer of deposited material 12 at the exposed sidewall, but to which the hardened top layer 20 is relatively impervious. The result is shown in FIG. 4. A suitable anisotropic etchant for either example is a low pressure oxygen plasma discharge, such as a pressure less than 100 mtorr, with substantial bias voltage on the substrate, in a reactive ion etch mode. This generates a very narrow channel feature 24 through the deposited material 12 via the exposed sidewall portion 16.

This feature may be useful in itself or used for subsequent processing of the substrate 10, which is now exposed at the bottom of the channel 24. The top layer 20 may be removed by the application of a fluorinated plasma, and the deposited material 12 can be removed as necessary or desireable by an oxygen plasma. The size of the feature channel 24 when formed in the manner just described may be much smaller than that obtainable with conventional lithography which is currently limited to about 0.7 μm.

As another example, a material 12 is deposited onto a substrate, and an edge 16 is defined, as in FIG. 1. The source ot the flux 25 in FIG. 2 may be either a low pressure plasma or an instrument designed specifically for this purpose. A suitable arrangement would consist of a reactive ion etch apparatus to which has been added a thermal source of methacrylic acid. The plasma is established in argon and the vapor pressure of the acid is adjusted so that the mean free path at this particular pressure is large compared to the internal dimensions of the vacuum chamber. Acid monomers adsorb on all exposed surfaces but only cross link where positive argon ions or electron activation has been supplied. The non-cross linked material is dissolved in a subsequent step leaving a hardened protective photoresist film layer only on the generally planar surfaces which had been irradiated.

There are many modifications and other embodiments of the invention that would readily come to one skilled in the art having the benefit of the teachings presented in this description and the associated drawings. Therefore it is to be understood that the invention is not limited to the specific teachings in this disclosure, and that the modifications and embodiments are intended to be included within the scope of the following claims.

What is claimed is:

1. A method for anisotropically hardening a protective coating to provide a well defined edge thereon for integrated circuit manufacture, the method comprising:

forming a non-planar coating on selected areas of a substrate with a photoresist material that is resistant to selected subsequent processing steps after exposure to incident flux, the sensitivity of the coating to the incident flux being a function of the angle between the incident flux and the coating;

antisotropically hardening the coating by exposing selected portions thereof to a predetermined dosage of directional flux incident at an angle to which the coating has a relatively high sensitivity so that those portions of the coating irradiated at an angle corresponding to a higher sensitivity are hardened to selected subsequent processing steps and those portions irradiated at an angle corresponding to a lower sensitivity are less hardened to selected subsequent processing steps; and removing those portions of the coating irradiated at an angle corresponding to a lower sensitivity to reveal selected portions of the substrate thereunder.

2. The method of claim 1 wherein the step of forming a non-planar coating on a substrate comprises forming a coating with a photoresist selected from the group consisting of: an organic polymer photoresist or a dyed positive photoresist susceptible to silylation.

3. The method of claim 1 wherein the step of forming a non-planar coating comprises coating a substrate with a photoresist film having a high sensitivity to flux perpendicularly incident to the surface thereof.

4. The method of claim 1 wherein the step of anisotropically hardening the coating comprises irradiating those portions of the coating that are to be more hardened to selected subsequent processing to radiation that is perpendicularly incident thereto.

5. The method of claim 1 wherein the step of removing portions of the irradiated coating comprises isotropically etching the coating to remove those portions of the coating irradiated at an angle corresponding to a lower sensitivity.

6. The method of claim 5 wherein the step of isotropically etching the coating comprises exposing the coating to a moderately high pressure plasma.

7. The method of claim 1 wherein the step of removing portions of the coating comprises removing portions of the coating until those portions irradiated at an angle corresponding to a lower sensitivity have been substantially entirely removed to reveal the substrate thereunder.

* * * * *